(12) United States Patent  
Montjaux et al.

(10) Patent No.: US 12,483,249 B2
(45) Date of Patent: Nov. 25, 2025

(54) DEVICE COMPRISING A SYNCHRONIZATION CIRCUIT FOR PERFORMING NEAR FIELD COMMUNICATION

(71) Applicants: STMICROELECTRONICS FRANCE, Montrouge (FR); STMICROELECTRONICS (GRENOBLE) SAS, Grenoble (FR)

(72) Inventors: Gregoire Montjaux, Claix (FR); Marc Houdebine, Crolles (FR)

(73) Assignees: STMicroelectronics (Grenoble 2) SAS, Grenoble (FR); STMicroelectronics France, Montrouge (FR)

(*) Notice: Subject to any disclaimer, the term of this patent is extended or adjusted under 35 U.S.C. 154(b) by 388 days.

(21) Appl. No.: 18/174,236

(22) Filed: Feb. 24, 2023

(65) Prior Publication Data

US 2023/0318658 A1    Oct. 5, 2023

(30) Foreign Application Priority Data

Mar. 11, 2022   (FR) ...................... 2202164

(51) Int. Cl.
*H03L 7/08*    (2006.01)
*H03L 7/099*   (2006.01)
(Continued)

(52) U.S. Cl.
CPC ............. *H03L 7/08* (2013.01); *H03L 7/0992* (2013.01); *H03L 7/0994* (2013.01); *H04L 7/033* (2013.01); *H04B 5/45* (2024.01)

(58) Field of Classification Search
CPC ..... H03L 7/0992; H03L 7/0994; H03L 7/033; H03L 7/087; H03L 2207/80; H03L 7/08; H04B 5/45

(Continued)

(56) References Cited

U.S. PATENT DOCUMENTS 9,998,178 B2    6/2018  Dedieu et al.
10,749,719 B2   8/2020  Houdebine
(Continued)

FOREIGN PATENT DOCUMENTS

CN    110061763 A    7/2019
CN    110943764 A    3/2020

OTHER PUBLICATIONS

Staszewski, Robert Bogdan et al., "Spur-Free Multirate All-Digital PLL for Mobile Phones in 65 nm CMOS", IEEE Journal of Solid-State Circuits, vol. 46, No. 12, Dec. 2011, 16 pages.

(Continued)

*Primary Examiner* — Eugene Yun
(74) *Attorney, Agent, or Firm* — Slater Matsil, LLP (57) ABSTRACT

A device is configured to receive a first carrier signal, and deliver a second carrier signal, and has a phase-locked loop including a first domain including an oscillator configured to generate a signal at a given frequency, and a circuit configured to generate information representative of the frequency of the signal generated by the oscillator, and to generate the second carrier signal and a clock signal, the first domain being clocked by the first carrier signal, a second domain, clocked by the clock signal, including a circuit configured to compare the frequency of the signal generated by the oscillator with the frequency of the first carrier signal and to control the oscillator, a matching circuit configured to transfer information representative of the frequency of the signal generated by the oscillator from the first domain to the second domain.

20 Claims, 3 Drawing Sheets

(51) Int. Cl.
*H04L 7/033* (2006.01)
*H04B 5/45* (2024.01)

(58) Field of Classification Search
USPC .......................................................... 455/41.1
See application file for complete search history.

(56) References Cited

U.S. PATENT DOCUMENTS

| | | |
|---|---|---|
| 10,841,887 B2 | 11/2020 | Houdebine |
| 2007/0057708 A1* | 3/2007 | Uehara ................. H03L 7/0812 |
| | | 327/156 |
| 2007/0290732 A1* | 12/2007 | Yeh ...................... H03K 3/0375 |
| | | 327/198 |
| 2012/0071089 A1 | 3/2012 | Charrat |
| 2017/0134031 A1* | 5/2017 | Ezell ......................... G06F 1/12 |
| 2018/0110018 A1 | 4/2018 | Yu |
| 2019/0230611 A1 | 7/2019 | Houdebine |
| 2019/0288694 A1* | 9/2019 | Parekh .................... H03L 7/143 |
| 2020/0099554 A1 | 3/2020 | Houdebine |
| 2023/0318658 A1 | 10/2023 | Montjaux |

OTHER PUBLICATIONS

Wei, Chih-Lu et al., "A Digital PLL Using Oversampling Delta-Sigma TDC", IEEE Transactions on Circuits and Systems—II: Express Briefs, vol. 63, No. 7, Jul. 2016, 5 pages.

* cited by examiner

DEVICE COMPRISING A SYNCHRONIZATION CIRCUIT FOR PERFORMING NEAR FIELD COMMUNICATION

CROSS-REFERENCE TO RELATED APPLICATIONS

This application claims the benefit of French Patent Application No. 2202164, filed on Mar. 11, 2022, which application is hereby incorporated herein by reference.

TECHNICAL FIELD

Implementations and embodiments of the invention relate to near-field communication.

BACKGROUND

Near-field communication (NFC) is a high-frequency wireless communication technology at short distance, which allows data exchange between two contactless devices over a short distance for example of the order of 10 cm.

NFC technology is an open technology platform standardized in the standards ISO/IEC 18092 and ISO/IEC 21481 but incorporates many existing standards such as the type A and type B protocols defined in the standard ISO-14443, which can be communication protocols that can be used in NFC technology.

Near-field communication can be performed between a reader and a device emulated in card mode. The reader is then configured to generate a magnetic field via its antenna which is generally in the standards conventionally used, a sine wave at 13.56 MHz. The strength of the magnetic field is comprised between 0.5 and 7.5 amperes/meter in root mean square (RMS).

Near-field communication can be performed in an active mode of operation. In this mode of operation, both the reader and the device emulated in card mode generate an electromagnetic field. Generally, this mode of operation is used when the device is provided with its own power source, for example a battery, as is the case in a cellular mobile telephone which is then emulated in card mode.

In particular, near-field communication can be performed using active load modulation (ALM). The active load modulation allows synchronization of the signals between the reader and the device emulated in card mode.

The reader is configured to emit an electromagnetic field, and the device emulated in card mode is configured to modulate an amplitude of the non-beat field. In order to respond to the reader, the device emulated in card mode generates a signal synchronized with the field of the reader so as to be in phase with the field of the reader. It is then also important for the reader to generate a sufficiently stable field to be able to detect small variations in its field according to the distance between the reader and the card emulator.

In reader mode or in card emulator mode, it is important that the device generates the cleanest clock possible and which allows communication to be ensured with a minimum of energy. This is achieved by reducing and even avoiding the presence of spurious tones in the generated clock.

The device emulated in card mode includes a phase-locked loop. The phase-locked loop comprises a phase and frequency servo-controlled oscillator from a signal having a reference frequency which may be different from 13.56 MHz. The signal having the reference frequency can be a signal coming from the field generated by the reader. Alternatively, the signal having the reference frequency can be a signal generated by a crystal oscillator of the platform which can be used for other functions than near-field communication. The oscillator is servo-controlled so as to obtain at the output of the phase-locked loop a signal having a desired frequency, for example 13.56 MHz. The oscillator is then servo-controlled so as to generate a signal having a frequency that is a multiple of the desired frequency, for example a frequency of 64×13.56 MHz for a desired frequency of 13.56 MHz. The device also includes a circuit allowing to divide the frequency of the signal generated by the oscillator so as to obtain a signal at the desired frequency, for example 13.56 MHz.

The oscillator can be controlled analogically or digitally.

When the oscillator is controlled analogically, the divided frequency signal is compared to the reference frequency signal. The comparison between the divided frequency signal and the reference frequency signal is clocked by the reference frequency signal. The frequency of the oscillator will thus vary with each clock stroke of the reference frequency signal. This induces spurious tones in the output signal, on either side of the desired carrier frequency at a distance Fref from the carrier frequency and at a distance f*Fref from the carrier frequency, where f is comprised between 0 and 1.

The oscillator can be controlled digitally. The oscillator can then be servo-controlled by comparing a number of clock strokes of a reference frequency signal with a number of clock strokes of the signal generated by the oscillator. The comparison is then also clocked at the reference frequency. It also induces spurious tones in the output signal, on either side of the desired carrier frequency at a distance Fref from the carrier frequency and at a distance f*Fref from the carrier frequency, where f is comprised between 0 and 1. The output signal is then noisy, thus reducing the quality of near-field communication.

There is therefore a need for a device configured to communicate in the near field comprising a synchronization circuit allowing to reduce or even avoid the spurious tones close to the frequency of the carrier in the output signal.

SUMMARY

Provision is made of a device configured to be able to communicate without contact with a reader by active load modulation, including an input for receiving a first carrier signal emitted by the reader, an output for delivering a second carrier signal and a synchronization circuit configured to synchronize a first carrier signal and the second carrier signal, the synchronization circuit comprising a phase-locked loop including:
  a first domain including a digitally controlled oscillator configured to generate a signal at a given frequency, and a circuit configured to generate information representative of the frequency of the signal generated by the oscillator, and to generate, from the signal generated by the oscillator, the second carrier signal and a clock signal with a frequency comprised between the frequency of the second carrier signal and the frequency of the signal generated by the oscillator, the first domain being clocked by the first carrier signal,
  a second domain including a circuit configured to digitally compare the frequency of the signal generated by the oscillator with the frequency of the first carrier signal and to control the oscillator according to a result of this comparison, the second domain being clocked by the clock signal, a frequency matching circuit between the first domain and the second domain, the matching circuit being configured to receive from the first domain information representative of the frequency of the signal generated by the oscillator at the frequency of the first carrier signal and to deliver this information to the second domain at the frequency of the clock signal.

In such a device, the comparison between the frequency of the signal generated by the oscillator and the frequency of the first carrier signal to control the oscillator is performed at the frequency of the clock signal. However, the frequency of the clock signal is higher than the frequency of the first carrier signal. This allows to remove spurious tones from the carrier in the second carrier signal. In this way, the output signal is more easily readable by the reader. Furthermore, using the clock signal to clock the second domain allows to obtain more responsive control of the oscillator.

Advantageously, the first domain includes a counter-divider configured to generate at the output:
- the second carrier signal from the signal generated by the oscillator so that the second carrier signal has a frequency reduced by a given factor compared to the frequency of the signal generated by the oscillator,
- the clock signal from the signal generated by the oscillator,
- the information representative of the frequency of the signal generated by the oscillator by counting a number of clock strokes of the signal generated by the oscillator.

In an advantageous embodiment, the counter divider includes:
- a first series of D flip-flops each mounted as a frequency divider so as to divide the frequency of the signal generated by the oscillator to obtain the second carrier signal and the clock signal,
- a second series of D flip-flops, each D flip-flop receiving as clock a signal inverted with respect to the reference frequency signal and taking as input the signal taken as clock from a D flip-flop of the same rank of the first series, and generating at the output a count value as information representative of the frequency of the signal generated by the oscillator.

Advantageously, the second domain includes:
- an accumulator configured to generate an output value by accumulating a value equal to the factor at each clock stroke of the first carrier signal,
- a frequency comparator and a phase shift adder between the signal generated by the oscillator and the first carrier signal,
- a loop filter connected to the output of the comparator via the phase shift adder.

Thus, the comparator and the loop filter are clocked by the clock signal having a higher frequency than the reference frequency. This allows to increase a speed of the phase-locked loop.

Preferably, the second domain also includes a sigma-delta modulation circuit connected to the output of the loop filter and allowing to control the oscillator. Thus, the sigma-delta modulation circuit is clocked by the clock signal having a higher frequency than the reference frequency. This improves the efficiency of the sigma-delta modulation circuit by increasing a number of steps that the sigma-delta modulation circuit can take.

In an advantageous embodiment, the frequency matching circuit includes a first-in, first-out (FIFO) register configured to receive as input the information representative of the frequency of the signal generated by the oscillator from the first domain of the phase-locked loop and for outputting this information representative of the frequency of the signal generated by the oscillator to the second domain of the phase-locked loop, the FIFO register being clocked at the input by the reference frequency signal and being clocked at the output by the clock signal.

Advantageously, the FIFO register includes:
- a Gray code counter configured to count each clock stroke of the reference frequency signal,
- a demultiplexer having an input configured to receive the information representative of the frequency of the signal generated by the oscillator at the input of the FIFO register, a selection input connected to an output of the Gray code counter, and a plurality of outputs which can be selected according to a value of the Gray code counter received by the selection input,
- a plurality of registers clocked by the reference frequency signal and each having an input connected to a given output of the demultiplexer so as to be able to store the information representative of the frequency of the signal generated by the oscillator at each clock stroke of the reference frequency signal,
- at least one register clocked by the clock signal and being configured to receive a value from the Gray counter,
- a multiplexer having inputs connected to the various registers of the plurality of registers and having a selection input connected to the at least one register, and an output allowing to transmit at the output of the FIFO register the information relating to the frequency of the signal generated by the oscillator.

Advantageously, the frequency matching circuit also includes a D flip-flop clocked by the reference frequency signal and having an input configured to receive the information relating to the frequency of the signal generated by the oscillator from the first domain and an output configured to transmit this information at the input of the FIFO register.

Preferably, the first carrier signal has a carrier frequency of the order of 13.56 MHz, the oscillator being configured to deliver a frequency signal of the order of 868 MHz, the counter divider being configured to divide the frequency of the signal generated by the oscillator by sixty-four and the accumulator being configured to accumulate a value equal to sixty-four at each clock stroke of the reference frequency signal.

Advantageously, the synchronization circuit also includes a frequency and phase-locked loop including:
- a first domain including the digitally controlled oscillator configured to generate a signal at a given frequency, and a circuit configured to generate information representative of the frequency of the signal generated by the oscillator, the first domain being clocked from a reference clock signal,
- a second domain including a circuit configured to digitally compare the frequency of the signal generated by the oscillator with the frequency of the first carrier signal and to control the oscillator according to a result of this comparison, the second domain being clocked by the clock signal,
- a frequency matching circuit between the first domain and the second domain, the matching circuit being configured to receive from the first domain the information representative of the frequency of the signal generated by the oscillator at the frequency of the signal generated by the internal reference oscillator and to deliver this information to the second domain at the frequency of the clock signal.

The reference clock signal can be generated by an internal reference oscillator or by a rendering of the signal from the reader when the device is operating in card emulator mode.

Preferably, the token generation circuit configured to generate a token signal each time the value of the Gray code counter changes, each element of the second domain being implemented when a token signal is generated.

BRIEF DESCRIPTION OF THE DRAWINGS

Other advantages and features of the invention will appear upon examining the detailed features of non-limiting embodiments, and of the appended drawings wherein.

DETAILED DESCRIPTION OF ILLUSTRATIVE EMBODIMENTS

Figure 1:
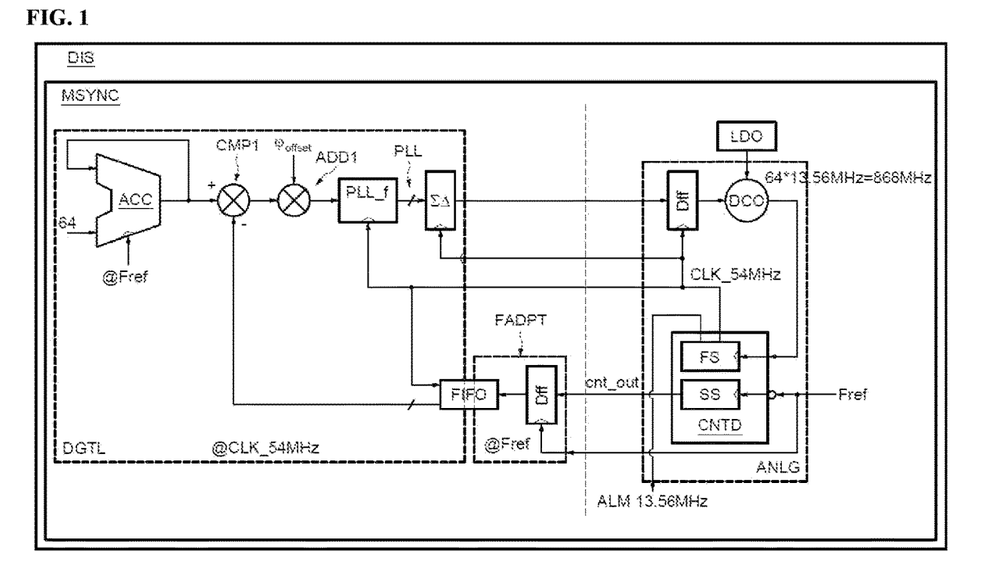
FIG. 1 illustrates a device having a synchronization circuit including a phase-locked loop.

To communicate with the reader, the device DIS comprises a synchronization circuit MSYNC as shown in FIG. 1. The synchronization circuit MSYNC includes a phase-locked loop PLL adapted for performing frequency synthesis.

The synchronization circuit MSYNC is configured to receive a first carrier signal Fref having a frequency of 13.56 MHz. This frequency is a reference frequency on which the device DIS aims at being synchronized using the synchronization circuit MSYNC, during communication from the device to the reader. This first carrier signal Fref is extracted from an electromagnetic field emitted by the reader and received by the antenna. The extraction of the first carrier signal Fref is carried out using a carrier signal extraction circuit (not shown) well known to the person skilled in the art.

The phase-locked loop PLL includes two domains ANLG, DGTL clocked by different frequencies. A first domain ANLG is clocked by the reference frequency signal Fref. The first domain ANLG includes a digitally controlled oscillator DCO. The oscillator DCO is power supplied by a regulator LDO. The oscillator DCO thus has an input connected to an output of a register, in particular a D flip-flop (Dff) storing a word or a bit allowing to control the oscillator DCO.

The oscillator DCO is configured to generate a signal having a frequency multiple of a desired frequency (that is to say synchronous with the reference frequency signal, for example 13.56 MHz) of an output signal ALM of the synchronization circuit MSYNC. For example, the oscillator DCO can be configured to generate a frequency of the order of 868 MHz (64*13.56 MHz).

The first domain ANLG also includes a counter-divider CNTD allowing to count a number of rising edges of the signal generated by the oscillator DCO. The counter-divider CNTD is configured to divide the frequency of the signal generated by the oscillator DCO so as to obtain the output signal ALM at the desired frequency.

Figure 2:
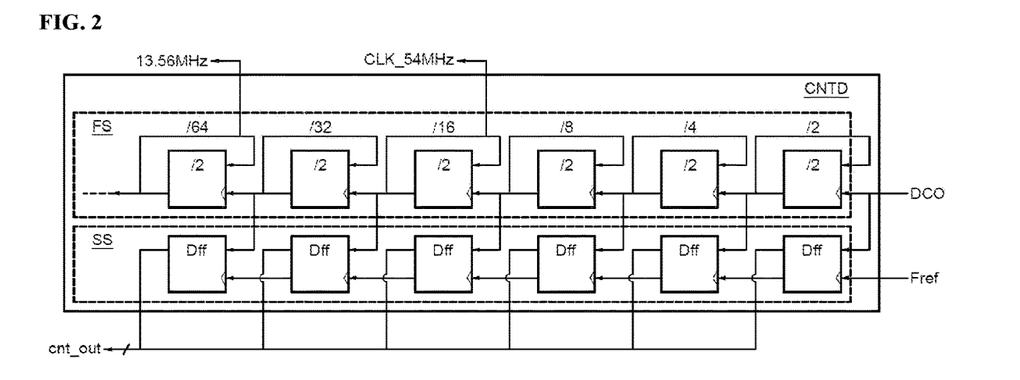
FIG. 2 illustrates counter-divider having a first series of flip-flops each mounted as a frequency divider by two in series.

More particularly, as illustrated in FIG. 2, the counter-divider CNTD comprises a first series FS of D flip-flops each mounted as a frequency divider by two in series. For example, the first series FS of D flip-flops can comprise six D flip-flops in series, each mounted as a frequency divider by two. A first D flip-flop then receives as a clock the signal generated by the oscillator DCO. Each D flip-flop also has an inverting output connected to an input of this same D flip-flop and a non-inverting output generating the clock signal of the next D flip-flop. In this way, each D flip-flop allows to divide by two the frequency of the signal generated by the oscillator DCO. The sixth D flip-flop thus allows to obtain a signal having a frequency divided by sixty-four with respect to the frequency of the signal generated by the oscillator DCO. This sixth D flip-flop thus allows to obtain a signal of desired frequency of 13.56 MHz when the frequency of the oscillator is of the order of 868 MHz.

The counter divider CNTD is also configured to generate a clock signal CLK_54 MHz of frequency higher than the desired frequency. This clock signal CLK_54 MHz is generated so as to be synchronous with the frequency of the oscillator DCO. For example, the counter divider CNTD is adapted to generate a frequency signal of the order of 54 MHz obtained at the output of the fourth D flip-flop of the first series of D flip-flops. This clock signal is used to clock the second domain of the phase-locked loop PLL.

The counter-divider CNTD also includes a second series SS of D flip-flops. For example, the second series SS of D flip-flops includes six D flip-flops. Each D flip-flop receives as a clock an inverted signal of the reference frequency signal and takes as input the signal taken as clock from a D flip-flop of the same rank of the first series, the first D flip-flop of the second series SS thus taking as input the signal generated by the oscillator DCO. The D flip-flops of the second series SS each have an output, the set of outputs of these D flip-flops allowing to generate a count value cnt_out.

The synchronization circuit MSYNC also includes a frequency matching circuit FADPT between the first domain ANLG and the second domain DGTL. The frequency matching circuit FADPT includes a D flip-flop at the output of the counter-divider CNTD. This flip-flop D receives the reference frequency signal Fref as clock. Thus, the clock of this D flip-flop is inverted with respect to the clock of the D flip-flops of the second series SS of D flip-flop of the counter-divider CNTD. The D flip-flop at the output of the counter-divider CNTD allows to memorize the count value by taking into account the transfer delay of the count value between the counter-divider CNTD and the D flip-flop.

Figure 3:
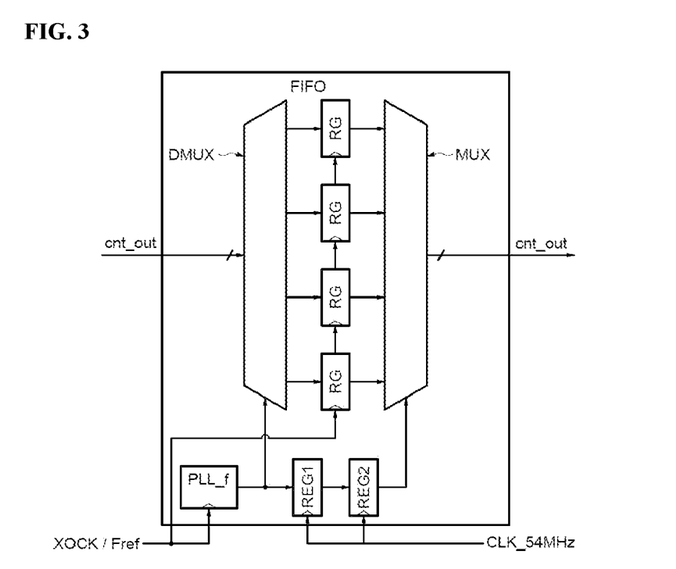
FIG. 3 illustrates FIFO register.

The frequency matching circuit FADPT further includes a FIFO register. The FIFO register is illustrated in FIG. 3. The FIFO register includes a demultiplexer DMUX receiving the count value cnt_out at the input. The FIFO register also includes a register RG for each output of the demultiplexer DMUX. Each register RG takes the reference frequency signal Fref as clock. The FIFO register also includes a multiplexer MUX having an input for each register RG. Each register RG can include a plurality of D flip-flops. The FIFO register also includes a Gray code counter Gr_ptr taking the reference frequency signal Fref as clock. The Gray code counter is therefore updated on each rising edge of the reference frequency signal Fref. In particular, the Gray code counter allows to modify only one bit of its value at each clock stroke of the reference frequency signal Fref. The Gray code counter has an output connected to a selection input of the demultiplexer DMUX. Thus, the value of the Gray code counter allows to select the register RG connected to the demultiplexer DMUX wherein the count value will be stored. The output of the Gray code counter is also connected to an input of a first register REG1 of a succession of registers REG1, REG2 mounted in series. Each register REG1, REG2 includes a plurality of D flip-flops connected in parallel. The last register REG2 has an output connected to a selection input of the multiplexer MUX. These registers take as clock the clock signal CLK_54 MHz of frequency higher than the desired frequency. This succession of registers allows to ensure that the count value has indeed been recorded in a register RG of the FIFO register before transmitting it at the output of the FIFO register. Here, the succession includes two registers REG1, REG2. Nevertheless, it is possible to provide a number of registers other than two. The multiplexer thus allows to transmit at the output of the FIFO register the count value cnt_out at the frequency of the clock signal CLK_54 MHz.

The output of the FIFO register is connected to an inverting input of a comparator CMP1 of the synchronization circuit MSYNC. The comparator CMP1 also includes an input receiving an output from an accumulator ACC. The accumulator ACC has an input receiving a value equal to the value multiplying the desired value of the oscillator DCO, for example sixty-four. The accumulator ACC also has an input connected to its output. The accumulator ACC takes the reference frequency signal Fref as clock. The accumulator ACC thus allows to obtain a value equal to the reference frequency multiplied by sixty-four.

The output of the comparator CMP1 corresponds to an error between the frequency of the signal generated by the oscillator DCO (equal to the frequency of the signal at the output of the synchronization circuit multiplied by sixty-four) and the reference frequency multiplied by sixty-four.

The output of the comparator CMP1 is connected to an input of an adder ADD1 of the synchronization circuit MSYNC. The adder ADD1 also includes a second input configured to receive a value $\phi_{offset}$ corresponding to a phase shift so as to offset the edges of the reference frequency signal. Adding this phase offset allows to compensate for phase errors from the synchronization circuit to the antenna.

The output of the adder ADD1 is connected to a loop filter PLL_f. The loop filter PLL_f takes as clock the clock signal CLK_54 MHz with a frequency higher than the desired frequency.

The output of the loop filter PLL_f is connected to an input of a sigma-delta ΣΔ modulation circuit. The sigma-delta ΣΔ modulation circuit takes as clock the signal of frequency CLK_54 MHz higher than the desired frequency. The output of the sigma-delta modulation circuit is connected to an input of the register configured to store the value allowing to control the oscillator DCO. This register takes as clock the inverse of the frequency signal CLK_54 MHz greater than the desired frequency.

Figure 4:
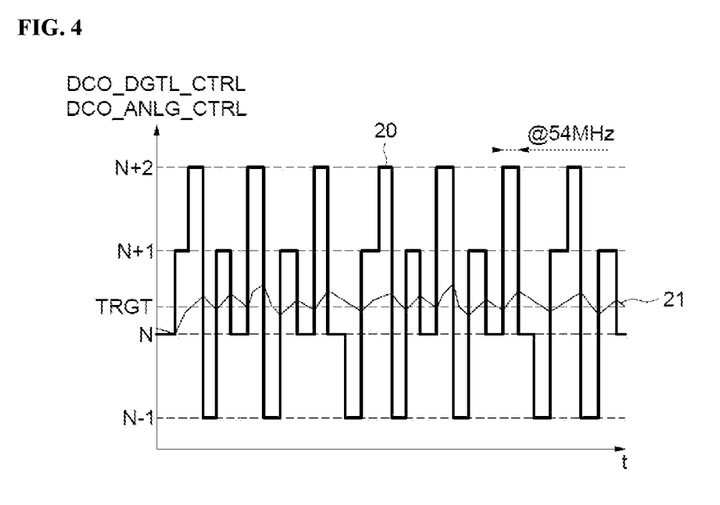
FIG. 4 illustrates a graph representing oscillator control using a sigma-delta modulation circuit.

Using the clock signal to clock the sigma-delta ΣΔ modulation circuit improves the sigma-delta modulation. Indeed, this allows to use more mixing steps at a higher frequency, so that the average value at the output of the sigma-delta ΣΔ modulation circuit approaches a desired value allowing to obtain at the output of the synchronization circuit an output signal ALM at the desired frequency. Furthermore, using the clock signal to clock the sigma-delta ΣΔ modulation circuit also allows spurious tones to be removed from the carrier. These spurious tones are then better filtered by the loop filter PLL_f. In this way, the output signal is less noisy. FIG. 4 illustrates a graph representing the oscillator control using such a sigma-delta modulation circuit. In particular, the curve 20 illustrates a digital control DCO_DGTL_CTRL of the oscillator DCO and curve 21 illustrates a resulting analogue control DCO_ANLG_CTRL of the oscillator DCO over time t. As illustrated, the digital control DCO_DGTL_CTRL can take four values N−1, N, N+1 and N+2 at the frequency of the clock signal, that is to say 54 MHz. The high frequency allows to obtain a refined analogue control DCO_ANLG_CTRL, close to a desired value TRGT.

Furthermore, it is possible to configure the comparator CMP1, the adder ADD1, the loop filter PLL_f and the sigma-delta ΣΔ modulation circuit in such a way that they can be implemented only when token signals are generated. In particular, the domain DGTL includes a token generation circuit configured to generate a token signal each time the value of the Gray counter detected at the frequency CLK_54 MHz changes, in particular by comparing the values stored in the registers REG1 and REG2. The token signal is therefore emitted at each update of the value of the counter in the domain ANLG. The token signals thus allow to implement these different elements only once for each clock stroke of the reference frequency signal to wait for the generation of the count value cnt_out.

Figure 5:
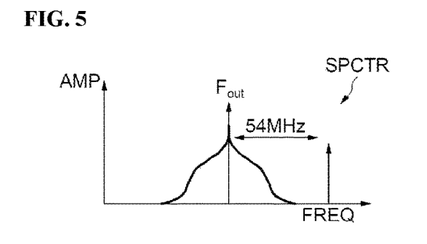
FIG. 5 illustrates a frequency spectrum of the active load modulation output signal.

FIG. 5 illustrates a frequency spectrum SPCTR of the output signal ALM. The output signal has a carrier Fout at 13.56 MHz. The fact of clocking the second domain DGTL allows to offset the spurious tones of 54 MHz with respect to the carrier Fout (the frequency of the clock signal CLK_54 MHz being 54 MHz).

Figure 6:
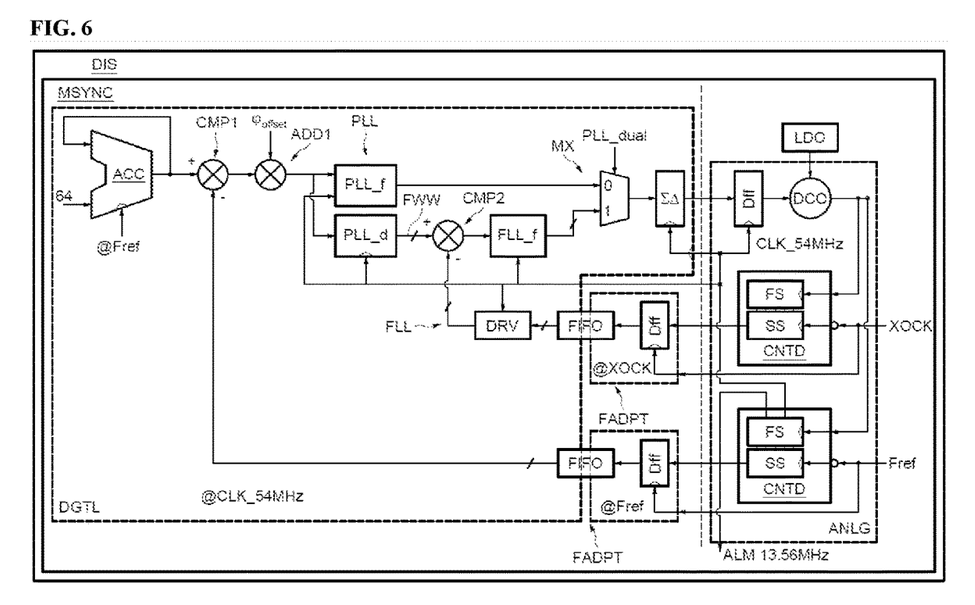
FIG. 6 illustrates another embodiment of a device configured to perform NFC by active load modulation.

FIG. 6 illustrates a second embodiment of a device DIS configured to perform near-field communication by active load modulation. Such an embodiment is advantageous for operation in card emulator mode. In card emulator mode, during a reception phase, the synchronization circuit MSYNC is configured to generate the desired frequency signal from the reference frequency extracted from the field. Then, during a transmission phase during which the reference frequency signal Fref is no longer available, the synchronization circuit MSYNC is configured to generate the desired frequency signal from a signal XOCK generated by an internal oscillator of the device DIS, for example a quartz oscillator (not shown).

The synchronization circuit MSYNC then includes two loops. In particular, the synchronization circuit MSYNC includes a phase-locked loop PLL identical to that described previously in relation to FIG. 1. This loop PLL thus in particular includes a counter-divider CNTD having the reference frequency signal Fref as clock, a D flip-flop at the output of the counter-divider Fref and a FIFO register allowing a transfer of data between the domain ANLG clocked by the reference frequency signal to the domain DGTL clocked by the clock signal CLK_54 MHz with a frequency higher than the desired frequency.

The synchronization circuit also includes a frequency and phase-locked loop FLL. In particular, this loop includes a counter-divider CNTD identical to that of the loop FLL and having the signal XOCK generated by the internal oscillator as clock. The frequency and phase-locked loop FLL also includes at the output of the counter-divider CNTD a flip-flop D, having this same signal XOCK as clock and a FIFO register allowing the transfer of data between the domain ANLG and the domain DGTL.

The loop further includes a differentiator having an input connected to the output of the FIFO register and an output connected to a second comparator CMP2.

The synchronization circuit also includes a first loop filter PLL_d having an input configured to receive the output of the adder ADD1. This loop filter PLL_d also has an output connected to an input of the third comparator CMP2.

The synchronization circuit also includes a second loop filter FLL_f. The loop filter FLL_f takes the output of the third comparator as input.

The synchronization circuit also includes a multiplexer MX taking as inputs the output of the loop filter PLL_f and the output of the loop filter FLL_f. The multiplexer includes a selection input configured to receive a signal PLL_dual allowing to choose which input of the multiplexer to send to the sigma-delta modulation circuit according to a desired mode of operation of the synchronization circuit. In particular, the signal PLL_dual allows operation with the phase-locked loop PLL or with the phase and frequency locked loop FLL. Operation with the phase-locked loop PLL (using in particular the loop filter PLL_f) is chosen when only the reference frequency of the reader is available. The value of the signal PLL_dual is then equal to zero. The operation with the phase and frequency locked loop (using in particular the loop filters PLL_d and FLL_f) is chosen when the reference signal XOCK is used. The value of the signal PLL_dual is then equal to one.

In such a synchronization circuit MSYNC, the phase-locked loop PLL allows to servo-control the frequency and phase-locked loop FLL before the device responds to the reader. In this way, when the device responds to the reader, the frequency and phase-locked loop FLL servo-controlled with respect to the internal oscillator allows to generate at the output of the synchronization circuit a signal of the desired frequency, for example at 13.56 MHz.

What is claimed is:

1. A device configured to be able to communicate without contact with a reader by active load modulation, the device comprising:
    an input for receiving a first carrier signal emitted by the reader;
    an output for delivering a second carrier signal; and
    a synchronization circuit configured to synchronize the first carrier signal and the second carrier signal, the synchronization circuit comprising a phase-locked loop comprising:
    a first domain including a digitally controlled oscillator configured to generate a signal at a given frequency, and a first circuit configured to generate information representative of the frequency of the signal generated by the oscillator, and to generate, from the signal generated by the oscillator, the second carrier signal and a clock signal with a frequency comprised between the frequency of the second carrier signal and the frequency of the signal generated by the oscillator, the first domain being clocked by the first carrier signal;
    a second domain including a second circuit configured to digitally compare the frequency of the signal generated by the oscillator with the frequency of the first carrier signal and to control the oscillator according to a result of the comparison, the second domain being clocked by the clock signal; and
    a frequency matching circuit between the first domain and the second domain, the frequency matching circuit configured to receive from the first domain information representative of the frequency of the signal generated by the oscillator at the frequency of the first carrier signal and to deliver the information to the second domain at the frequency of the clock signal.

2. The device according to claim 1, wherein the first domain includes a counter-divider configured to generate at the output:
    the second carrier signal from the signal generated by the oscillator so that the second carrier signal has a frequency reduced by a given factor compared to the frequency of the signal generated by the oscillator;
    the clock signal from the signal generated by the oscillator; and
    the information representative of the frequency of the signal generated by the oscillator by counting a number of clock strokes of the signal generated by the oscillator.

3. The device according to claim 2, wherein the counter-divider includes:
    a first series of D flip-flops each mounted as a frequency divider so as to divide the frequency of the signal generated by the oscillator to obtain the second carrier signal and the clock signal; and
    a second series of D flip-flops, each D flip-flop receiving as clock a signal inverted with respect to the first carrier signal and taking as input the signal taken as clock from a D flip-flop of a same rank of the first series, and generating at the output a count value as information representative of the frequency of the signal generated by the oscillator.

4. The device according to claim 2, wherein the second domain includes:
    an accumulator configured to generate an output value by accumulating a value equal to the factor at each clock stroke of the first carrier signal;
    a frequency comparator and a phase shift adder between the signal generated by the oscillator and the first carrier signal; and
    a loop filter connected to the output of the comparator via the phase shift adder.

5. The device according to claim 4, wherein the second domain also includes a sigma-delta modulation circuit connected to the output of the loop filter and allowing to control the oscillator.

6. The device according to claim 4, wherein the first carrier signal has a carrier frequency of an order of 13.56 MHz, the oscillator being configured to deliver a frequency signal of an order of 868 MHz, the counter divider being configured to divide the frequency of the signal generated by the oscillator by sixty-four and the accumulator being configured to accumulate a value equal to sixty-four at each clock stroke of the first carrier signal.

7. The device according to claim 1, wherein the frequency matching circuit includes a FIFO register configured to receive as input the information representative of the frequency of the signal generated by the oscillator from the first domain of the phase-locked loop and for outputting the information representative of the frequency of the signal generated by the oscillator to the second domain of the phase-locked loop, the FIFO register being clocked at the input by the first carrier signal and being clocked at the output by the clock signal.

8. The device according to claim 7, wherein the FIFO register includes:
    a Gray code counter configured to count each clock stroke of the first carrier signal;
    a demultiplexer having an input configured to receive the information representative of the frequency of the signal generated by the oscillator at the input of the FIFO register, a selection input connected to an output of the Gray code counter, and a plurality of outputs which can be selected according to a value of the Gray code counter received by the selection input;

a plurality of registers clocked by the first carrier signal and each having an input connected to a given output of the demultiplexer so as to be able to store the information representative of the frequency of the signal generated by the oscillator at each clock stroke of the first carrier signal;

at least one register clocked by the clock signal and configured to receive a value from the Gray code counter; and a multiplexer having inputs connected to various registers of the plurality of registers and having a selection input connected to the at least one register, and an output allowing to transmit at the output of the FIFO register the information relating to the frequency of the signal generated by the oscillator.

9. The device according to claim 8, wherein the frequency matching circuit also includes a D flip-flop clocked by the first carrier signal and having an input configured to receive the information relating to the frequency of the signal generated by the oscillator from the first domain and an output configured to transmit the information at the input of the FIFO register.

10. The device according to claim 8, further including a token generation circuit configured to generate a token signal each time the value of the Gray code counter changes, each element of the second domain being implemented when the token signal is generated.

11. The device according to claim 1, wherein the synchronization circuit also includes a frequency and phase-locked loop including:

a third domain including a digitally controlled second oscillator configured to generate a signal at another given frequency, and a third circuit configured to generate information representative of the frequency of the signal generated by the second oscillator, the third domain being clocked from a reference clock signal;

a fourth domain including a fourth circuit configured to digitally compare the frequency of the signal generated by the second oscillator with the frequency of the first carrier signal and to control the second oscillator according to a result of the comparison, the fourth domain being clocked by the clock signal; and a second frequency matching circuit between the third domain and the fourth domain, the second frequency matching circuit configured to receive from the third domain the information representative of the frequency of the signal generated by the second oscillator at the frequency of the reference cloak signal generated by an internal reference second oscillator, and to deliver the information to the fourth domain at the frequency of the clock signal.

12. A device configured to be able to communicate without contact with a reader by active load modulation, the device comprising:

an input for receiving a first carrier signal emitted by the reader;

an output for delivering a second carrier signal; and a synchronization circuit configured to synchronize the first carrier signal and the second carrier signal, the synchronization circuit comprising a phase-locked loop comprising:

a first domain including:

a digitally controlled oscillator configured to generate a signal at a given frequency;

a first circuit configured to generate information representative of the frequency of the signal generated by the oscillator, and to generate, from the signal generated by the oscillator, the second carrier signal and a clock signal with a frequency comprised between the frequency of the second carrier signal and the frequency of the signal generated by the oscillator, the first domain being clocked by the first carrier signal; and a counter-divider configured to generate at the output:

the second carrier signal from the signal generated by the oscillator so that the second carrier signal has a frequency reduced by a given factor compared to the frequency of the signal generated by the oscillator;

the clock signal from the signal generated by the oscillator; and the information representative of the frequency of the signal generated by the oscillator by counting a number of clock strokes of the signal generated by the oscillator;

a second domain including a second circuit configured to digitally compare the frequency of the signal generated by the oscillator with the frequency of the first carrier signal and to control the oscillator according to a result of the comparison, the second domain being clocked by the clock signal; and a frequency matching circuit between the first domain and the second domain, the frequency matching circuit configured to receive from the first domain information representative of the frequency of the signal generated by the oscillator at the frequency of the first carrier signal and to deliver the information to the second domain at the frequency of the clock signal, the frequency matching circuit including a FIFO register configured to receive as input the information representative of the frequency of the signal generated by the oscillator from the first domain of the phase-locked loop and for outputting the information representative of the frequency of the signal generated by the oscillator to the second domain of the phase-locked loop, the FIFO register being clocked at the input by the first carrier signal and being clocked at the output by the clock signal.

13. The device according to claim 12, wherein the counter divider includes:

a first series of D flip-flops each mounted as a frequency divider so as to divide the frequency of the signal generated by the oscillator to obtain the second carrier signal and the clock signal; and a second series of D flip-flops, each D flip-flop receiving as clock a signal inverted with respect to the first carrier signal and taking as input the signal taken as clock from a D flip-flop of a same rank of the first series, and generating at the output a count value as information representative of the frequency of the signal generated by the oscillator.

14. The device according to claim 12, wherein the second domain includes:

an accumulator configured to generate an output value by accumulating a value equal to the factor at each clock stroke of the first carrier signal;

a frequency comparator and a phase shift adder between the signal generated by the oscillator and the first carrier signal; and a loop filter connected to the output of the comparator via the phase shift adder.

15. The device according to claim 14, wherein the second domain also includes a sigma-delta modulation circuit connected to the output of the loop filter and allowing to control the oscillator.

16. The device according to claim 14, wherein the first carrier signal has a carrier frequency of an order of 13.56 MHz, the oscillator configured to deliver a frequency signal of an order of 868 MHz, the counter divider configured to divide the frequency of the signal generated by the oscillator by sixty-four and the accumulator configured to accumulate a value equal to sixty-four at each clock stroke of the first carrier signal.

17. The device according to claim 12, wherein the FIFO register includes:
   a Gray code counter configured to count each clock stroke of the first carrier signal;
   a demultiplexer having an input configured to receive the information representative of the frequency of the signal generated by the oscillator at the input of the FIFO register, a selection input connected to an output of the Gray code counter, and a plurality of outputs which can be selected according to a value of the Gray code counter received by the selection input;
   a plurality of registers clocked by the first carrier signal and each having an input connected to a given output of the demultiplexer so as to be able to store the information representative of the frequency of the signal generated by the oscillator at each clock stroke of the first carrier signal;
   at least one register clocked by the clock signal and configured to receive a value from the Gray code counter; and
   a multiplexer having inputs connected to various registers of the plurality of registers and having a selection input connected to the at least one register, and an output allowing to transmit at the output of the FIFO register the information relating to the frequency of the signal generated by the oscillator.

18. The device according to claim 17, wherein the frequency matching circuit also includes a D flip-flop clocked by the first carrier signal and having an input configured to receive the information relating to the frequency of the signal generated by the oscillator from the first domain and an output configured to transmit the information at the input of the FIFO register.

19. The device according to claim 17, further including a token generation circuit configured to generate a token signal each time the value of the Gray code counter changes, each element of the second domain being implemented when the token signal is generated.

20. The device according to claim 13, wherein the synchronization circuit also includes a frequency and phase-locked loop including:
   a third domain including a digitally controlled second oscillator configured to generate a signal at another given frequency, and a third circuit configured to generate information representative of the frequency of the signal generated by the second oscillator, the third domain being clocked from a reference clock signal;
   a fourth domain including a fourth circuit configured to digitally compare the frequency of the signal generated by the second oscillator with the frequency of the first carrier signal and to control the second oscillator according to a result of the comparison, the fourth domain being clocked by the clock signal; and
   a second frequency matching circuit between the third domain and the fourth domain, the second frequency matching circuit configured to receive from the third domain the information representative of the frequency of the signal generated by the second oscillator at the frequency of the reference cloak signal generated by an internal reference second oscillator and to deliver the information to the fourth domain at the frequency of the clock signal.

* * * * *